(12) United States Patent
Matsumoto et al.

(10) Patent No.: US 8,702,464 B2
(45) Date of Patent: Apr. 22, 2014

(54) METHOD OF MANUFACTURING A DISPLAY DEVICE THAT PREVENTS UNEVENNESS OF THE ORGANIC FILM

(71) Applicants: Yuko Matsumoto, Onjuku (JP); Hidehiro Sonoda, Mobara (JP); Noboru Kunimatsu, Chiba (JP)

(72) Inventors: Yuko Matsumoto, Onjuku (JP); Hidehiro Sonoda, Mobara (JP); Noboru Kunimatsu, Chiba (JP)

(73) Assignees: Japan Display Inc., Tokyo (JP); Panasonic Liquid Crystal Display Co., Ltd., Hyogo (JP)

( * ) Notice: Subject to any disclaimer, the term of this patent is extended or adjusted under 35 U.S.C. 154(b) by 0 days.

(21) Appl. No.: 13/707,029

(22) Filed: Dec. 6, 2012

(65) Prior Publication Data

US 2013/0095720 A1    Apr. 18, 2013

Related U.S. Application Data

(63) Continuation of application No. 13/220,728, filed on Aug. 30, 2011, now Pat. No. 8,366,504.

(30) Foreign Application Priority Data

Sep. 3, 2010   (JP) .................................. 2010-197724

(51) Int. Cl.
*H01J 9/227*   (2006.01)

(52) U.S. Cl.
USPC ................ 445/24; 445/25; 313/506; 313/507

(58) Field of Classification Search
USPC ......... 445/24, 25; 438/26–29, 34, 82; 257/40, 257/98–100
See application file for complete search history.

(56) References Cited

U.S. PATENT DOCUMENTS 8,020,960 B2 *   9/2011   Lee ................................. 347/19
8,034,182 B2 *  10/2011   Yamazaki et al. ............ 118/726

FOREIGN PATENT DOCUMENTS

JP        2007-69382         3/2007

* cited by examiner

*Primary Examiner* — Tracie Y Green
(74) *Attorney, Agent, or Firm* — Antonelli, Terry, Stout & Kraus, LLP.

(57) ABSTRACT

A method of manufacturing an organic EL display device that includes an element substrate on which a first organic luminescent material and a second organic luminescent material are formed, includes forming the first organic luminescent material by dripping the first organic luminescent material from an inkjet nozzle on the element substrate while relatively moving the inkjet nozzle and the element substrate in a first direction, and forming the second organic luminescent material by dripping the second organic luminescent material from an inkjet nozzle on the element substrate while relatively moving the inkjet nozzle and the element substrate in a direction perpendicular to the first direction.

2 Claims, 10 Drawing Sheets

METHOD OF MANUFACTURING A DISPLAY DEVICE THAT PREVENTS UNEVENNESS OF THE ORGANIC FILM

CLAIM OF PRIORITY

This application is a continuation application of U.S. Ser. No. 13/220,728, filed Aug. 30, 2011, the contents of which are incorporated herein by reference.

The present application claims priority from Japanese Patent Application JP 2010-197724 filed on Sep. 3, 2010, the content of which is hereby incorporated by reference into this application.

BACKGROUND OF THE INVENTION

1. Field of the Invention

The present invention relates to a method of manufacturing a display device. More specifically, the present invention relates to a method of manufacturing a liquid crystal display device or an organic EL display device that prevents brightness unevenness related to printing unevenness of orientation film or prevents display unevenness due to inkjet coating unevenness of organic film.

2. Description of the Related Art

A liquid crystal display panel used for the liquid crystal display device includes a TFT substrate and a counter substrate that faces the TFT substrate. Pixels having, for instance, a pixel electrode and a thin-film transistor (TFT) are formed in a matrix pattern on the TFT substrate. A color filter, for example, is formed on the counter substrate and disposed at a place corresponding to the pixel electrode on the TFT substrate. Liquid crystal is sandwiched between the TFT substrate and the counter substrate. An image is formed by exercising pixel-specific control over the light transmittance of liquid crystal molecules.

In the liquid crystal display device, the orientation film formed by the TFT substrate and the counter substrate provides initial orientation of the liquid crystal molecules. A video signal is applied to the pixel electrode so that an electric field formed between the pixel electrode and a counter electrode changes the status of the initial orientation of the liquid crystal molecules, thereby controlling the amount of light transmitted through the liquid crystal display panel. The initial orientation of the liquid crystal molecules is defined by rubbing the orientation film.

The orientation film is obtained, for instance, by applying a liquid organic material having a predetermined viscosity to the TFT substrate or the counter substrate by performing offset printing, and then imidizing an orientation film material by baking it. Orientation film offset printing is accomplished by dripping the orientation film material onto a cylindrical anilox roll from an injection nozzle, uniformly applying the orientation film material to the anilox roll with liquid spread means (a doctor blade), transferring the applied orientation film material to a printing plate, and printing the TFT substrate or the counter substrate from the printing plate.

A technology described in JP-A-2007-69382 prevents thickness unevenness of orientation film by uniformly applying the orientation film material to the anilox roll with two doctor blades.

SUMMARY OF THE INVENTION

FIG. 1 is a schematic diagram illustrating a configuration for offset printing of orientation film. Referring to FIG. 1, an orientation film material 6 drips onto an anilox roll 1 from an injection nozzle 3. The injection nozzle 3 is scanned in the direction of the arrow to uniformly apply the orientation film material to the anilox roll 1. Although the anilox roll 1 rotates, the doctor blade 4 operates in this instance so that the orientation film material 6 is more uniformly applied to the anilox roll 1.

The orientation film material 6 applied to the anilox roll 1 is transferred to a printing plate 2. The transferred orientation film material 6 is further transferred to a TFT substrate 10 so that the orientation film is printed onto the TFT substrate 10. While the printing plate 2 rotates, it transfers the orientation film to the TFT substrate 10. The direction of the substrate that agrees with the direction of rotation of the printing plate 2 is hereinafter referred to as the orientation film printing direction 5.

If the doctor blade 4 is warped or damaged during orientation film printing, an orientation film having thickness unevenness is formed. When the technology described in JP-A-2007-69382 is used, the thickness unevenness of the orientation film is corrected to a certain extent due to the use of two doctor blades. However, it is difficult for the above technology to correct such film thickness unevenness perfectly. The same holds true for a counter substrate 20.

Referring to FIG. 1, when the TFT substrate 10 moves in the direction of the white arrow, the orientation film is printed onto the TFT substrate 10 in the direction of the white arrow. If, for example, the doctor blade 4 is damaged in this instance, streaks indicative of film thickness unevenness appear in such a direction.

FIGS. 7A and 7B relate to the use of a conventional method and indicate the directions of orientation film printing for the TFT substrate 10 and the counter substrate 20. FIG. 7A shows the TFT substrate 10, whereas FIG. 7B shows the counter substrate 20. In FIGS. 7A and 7B, the white arrows indicate the directions of orientation film printing 5. As shown in FIGS. 7A and 7B, the direction of orientation film printing on the TFT substrate 10 is the same as the direction of orientation film printing on the counter substrate 20. An enlarged view of area A is presented in the lower half of FIG. 7A. As indicated in the enlarged view, a pixel 13 is formed in a portion enclosed by a scanning line 11 and a video signal line 12. The direction of orientation film printing shown in FIG. 7A is the same as the extension direction of the scanning line 11.

FIG. 7B shows the counter substrate 20. An enlarged view of area B is presented in the lower half of FIG. 7B. The direction of orientation film printing shown in FIG. 7B is the direction crossing a red color filter 21, a green color filter 22, and a blue color filter 23. This direction is the same as the extension direction of the scanning line 11 for the TFT substrate. FIG. 8 shows a combination of the TFT substrate 10 and the counter substrate 20, which are formed as described above and bonded to each other.

Referring to FIG. 8, the white arrows indicate the directions of orientation film printing 5 for the counter substrate 20 and the TFT substrate 10. If streaks indicative of orientation film thickness unevenness are formed due, for instance, to the use of a damaged or warped doctor blade 4 in a situation shown in FIG. 8, the frequency at which the resulting brightness unevenness appears is twice the frequency at which the TFT substrate 10 and the counter substrate 20 respectively exhibit brightness unevenness.

FIG. 9 shows an example of streaky brightness unevenness 40. FIG. 9 shows the case where the streaky unevenness 40 appears alternately in a display region 30 formed by the TFT substrate 10 and the counter substrate 20. FIG. 10 shows another example of streaky unevenness 40 in the display region 30. FIG. 10 shows the case where the streaky unevenness of the TFT substrate 10 and the streaky unevenness of the counter substrate 20 are formed relatively close to each other. In both cases shown in FIGS. 9 and 10, the streaky unevenness is conspicuous because it is frequently formed in the same direction.

The problem described above may occur when the orientation film is formed by offset printing. However, if process-specific film thickness unevenness is mutually enhanced between the TFT substrate 10 and the counter substrate 20, the problem may also occur when the orientation film is formed by a different method, for example, by an inkjet method.

The present invention has been made to prevent brightness unevenness from being caused by orientation film thickness unevenness that may result from an employed method of orientation film formation as described above.

The present invention provides a liquid crystal display device manufacturing method that addresses the above problem. More specifically, there is provided a method of manufacturing a liquid crystal display device that includes a TFT substrate having a TFT, a pixel electrode, a scanning line, a video signal line, and an orientation film, a counter substrate having an orientation film, and a liquid crystal layer sandwiched between the orientation film for the TFT substrate and the orientation film for the counter substrate. The liquid crystal display device manufacturing method includes the steps of: forming the orientation film for the TFT substrate by offset printing that is performed to transfer an orientation film material from a printing plate to the TFT substrate, the direction in which the printing plate rotates during the offset printing being a first direction of the TFT substrate; and forming the orientation film for the counter substrate by offset printing that is performed to transfer an orientation film material from a printing plate to the counter substrate, the direction in which the printing plate rotates during the offset printing being perpendicular to the first direction of the TFT substrate.

The present invention is also applicable to the case where an inkjet method is used for orientation film formation. More specifically, there is provided a method of manufacturing a liquid crystal display device that includes a TFT substrate having a TFT, a pixel electrode, a scanning line, a video signal line, and an orientation film, a counter substrate having an orientation film, and a liquid crystal layer sandwiched between the orientation film for the TFT substrate and the orientation film for the counter substrate. The liquid crystal display device manufacturing method includes the steps of: forming the orientation film for the TFT substrate by dripping an orientation film material from an inkjet nozzle while relatively moving the inkjet nozzle and the TFT substrate in a first direction; and forming the orientation film for the counter substrate by dripping an orientation film material from an inkjet nozzle while relatively moving the inkjet nozzle and the counter substrate in a direction perpendicular to the first direction.

The present invention is also applicable to the case where an organic EL display device is to be manufactured. More specifically, there is provided a method of manufacturing an organic EL display device that includes an element substrate on which a first organic luminescent material and a second organic luminescent material are formed. The organic EL display device manufacturing method includes the steps of: forming the first organic luminescent material by dripping a first orientation film from an inkjet nozzle while relatively moving the inkjet nozzle and the element substrate in a first direction; and forming the second organic luminescent material by dripping a second orientation film from an inkjet nozzle while relatively moving the inkjet nozzle and the element substrate in a direction perpendicular to the first direction.

When the present invention is applied to a liquid crystal display device, the frequency at which streaky brightness unevenness appears in the same direction is reduced to half. Thus, the degree of streaky brightness unevenness is greatly decreased. Further, although the present invention permits the streaky brightness unevenness to exist in both the vertical direction and horizontal direction of a display screen, the frequency of streaky unevenness appearance is low in both the vertical and horizontal directions. In addition, as the streaky unevenness exists in both the vertical and horizontal directions, the streaky unevenness turns out to be inconspicuous to the human eye.

Even when the present invention is applied to an organic EL display device to form an organic EL layer by the inkjet method, coating unevenness caused by the inkjet method is dispersed in both the vertical and horizontal directions of the display screen. Consequently, the degree of display unevenness is reduced.

DETAILED DESCRIPTION OF THE EMBODIMENTS

The present invention will now be described in detail by way of embodiments.

First Embodiment

Figure 1:
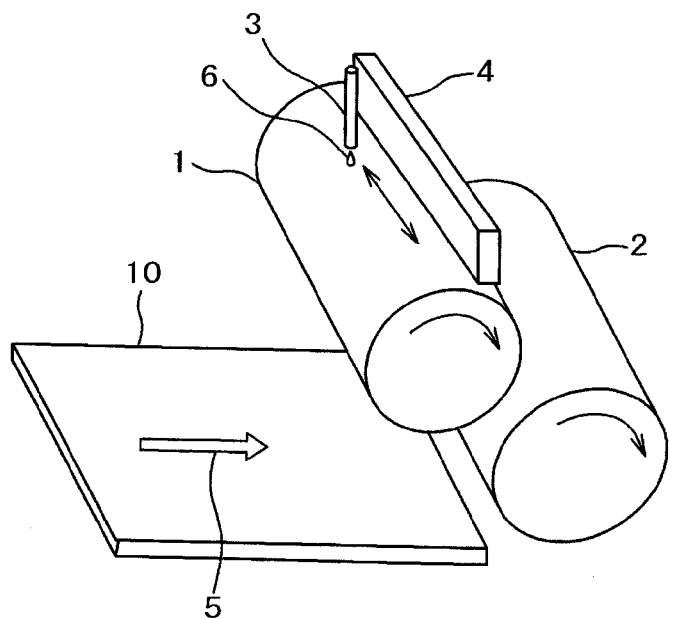
FIG. 1 is a perspective view illustrating a method of forming an orientation film on a TFT substrate by an offset printing method in accordance with the present invention.

FIG. 1 is a schematic diagram illustrating a method of printing an orientation film for a TFT substrate 10 in accordance with the present invention. The operation indicated in FIG. 1 will not be redundantly described because it has been described earlier. Referring to FIG. 1, the TFT substrate 10 moves in the direction of the white arrow. The direction indicated by the white arrow is the direction of orientation film printing 5. The direction of orientation film printing 5, which is shown in FIG. 1, is parallel to the long sides of the substrate.

Figure 2:
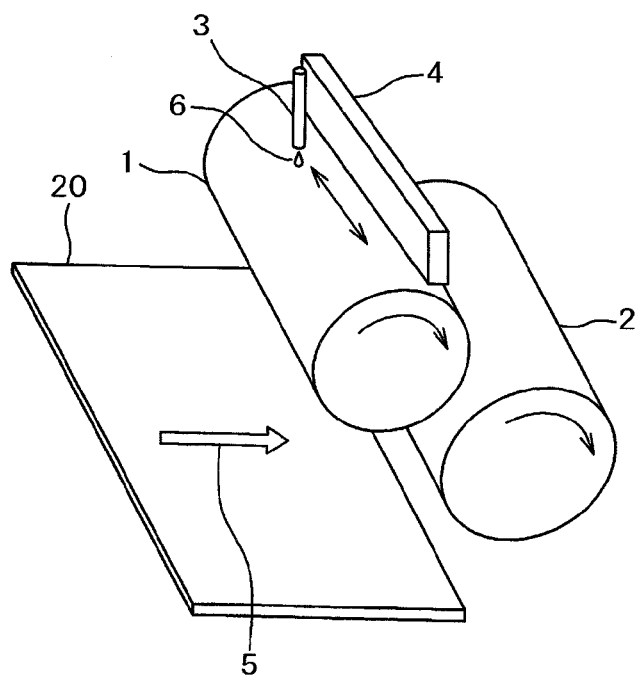
FIG. 2 is a perspective view illustrating a method of forming an orientation film on a counter substrate by an offset printing method in accordance with the present invention.

FIG. 2 is a schematic diagram illustrating a method of printing an orientation film for a counter substrate 20 in accordance with the present invention. The operation indicated in FIG. 2 will not be redundantly described because it is the same as the operation indicated in FIG. 1. Referring to FIG. 2, the counter substrate 20 moves in the direction of the white arrow. The direction indicated by the white arrow is the direction of orientation film printing 5. The direction of orientation film printing 5, which is shown in FIG. 2, is parallel to the short sides of the counter substrate 20.

Figure 3A:
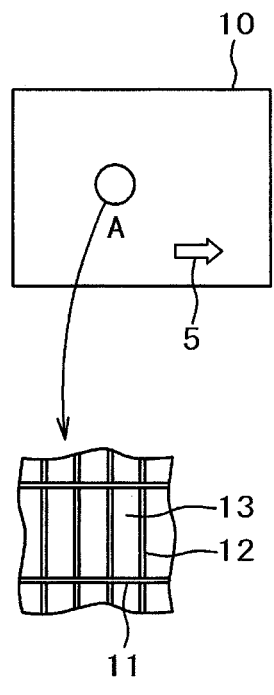
FIGS. 3A and 3B are schematic diagrams illustrating the directions in which the orientation films are printed onto the TFT substrate and the counter substrate in accordance with the present invention.
Figure 3B:
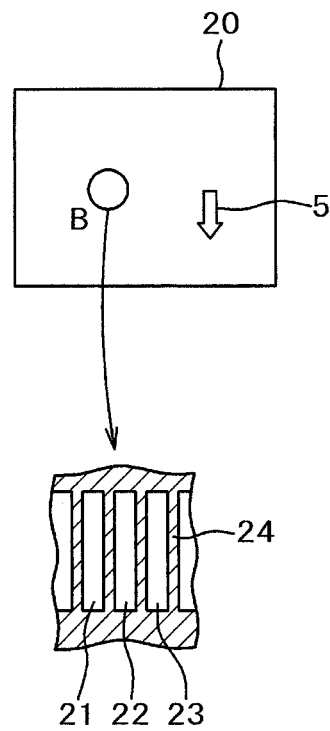

FIGS. 3A and 3B show the directions in which the orientation films are printed onto the TFT substrate 10 and the counter substrate 20 when offset printing is performed as indicated in FIGS. 1 and 2. FIG. 3A shows the TFT substrate 10, whereas FIG. 3B shows the counter substrate 20. The white arrows in FIGS. 3A and 3B indicate the direction of orientation film printing. As shown in FIGS. 3A and 3B, the direction of orientation film printing 5 for the TFT substrate 10 is perpendicular to the direction of orientation film printing 5 for the counter substrate 20.

An enlarged view of area A is presented in the lower half of FIG. 3A. Referring to the enlarged view, a scanning line 11 is extended in a horizontal direction whereas a video signal line 12 is extended in a vertical direction. A region enclosed by the scanning line 11 and the video signal line 12 serves as a pixel 13. The direction of orientation film printing 5 shown in FIG. 3A is the same as the extension direction of the scanning line 11.

An enlarged view of area B is presented in the lower half of FIG. 3B. Referring to the enlarged view, a red color filter 21, a green color filter 22, and a blue color filter 23 are formed. The direction of orientation film printing 5 shown in FIG. 3B is the same as the extension direction of the color filters shown in the enlarged view. In other words, the direction of orientation film printing 5 is perpendicular to the extension direction of the scanning line 11 shown in FIG. 3A. This is a feature of the present invention.

Figure 4:
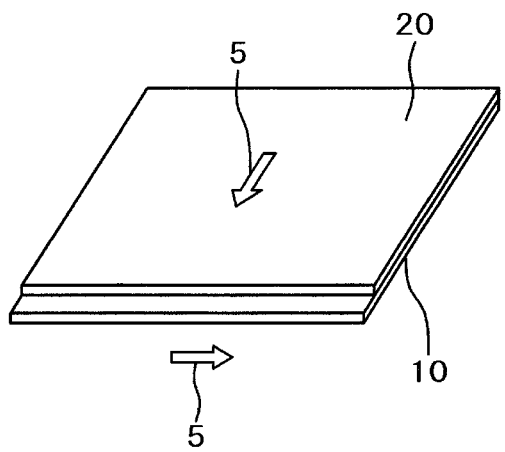
FIG. 4 is a perspective view illustrating the directions in which the orientation films are printed onto the TFT substrate and counter substrate for a liquid crystal display panel in accordance with the present invention.

FIG. 4 shows a liquid crystal display panel that is obtained by bonding the TFT substrate 10, which is formed as described above, to the counter substrate 20, which is also formed as described above. In FIG. 4, the direction of orientation film printing 5 is indicated by the white arrows. The direction of orientation film printing 5 for the counter substrate 20 is the same as the direction of the short sides of the counter substrate 20. The direction of orientation film printing 5 for the TFT substrate 10 is the same as the direction of the long sides of the TFT substrate 10. The direction of orientation film printing 5 for the counter substrate 20 is perpendicular to the direction of orientation film printing 5 for the TFT substrate 10.

When the orientation films are to be formed by offset printing, it is difficult to obtain perfectly uniform orientation film thickness due, for instance, to the use of a damaged or warped doctor blade 4. Hence, it is difficult to completely eliminate streaky orientation film thickness unevenness. It means that streaky brightness unevenness resulting from orientation film thickness unevenness is unavoidable.

Figure 5:
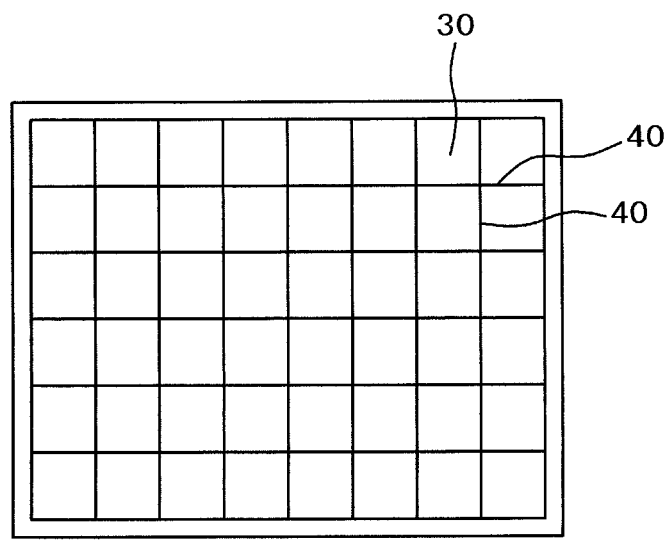
FIG. 5 shows an example of streaky brightness unevenness in a liquid crystal display device according to the present invention.

As regards the liquid crystal display panel shown in FIG. 4, the direction of thickness unevenness of the orientation film formed on the TFT substrate 10 is perpendicular to the direction of thickness unevenness of the orientation film formed on the counter substrate 20. FIG. 5 shows streaky brightness unevenness 40 that occurs in a display region 30 due to the above-described orientation film thickness unevenness. In FIG. 5, streaky brightness unevenness 40 caused by the orientation film thickness unevenness on the TFT substrate 10 side is indicated by horizontal lines, whereas streaky brightness unevenness 40 caused by the orientation film thickness unevenness on the counter substrate 20 side is indicated by vertical lines.

In the present invention, as shown in FIG. 5, the direction of the streaky brightness unevenness 40 caused by the thickness unevenness of the orientation film formed on the TFT substrate 10 is perpendicular to the direction of the streaky brightness unevenness 40 caused by the thickness unevenness of the orientation film formed on the counter substrate 20. Referring to FIG. 5, the frequency of brightness unevenness extended in the same direction is half the frequency of conventionally encountered brightness unevenness. Further, unlike the case where the conventional technology is used, brightness unevenness is not made conspicuous by allowing the brightness unevenness extended in a certain direction over the TFT substrate 10 to accentuate the brightness unevenness extended in the same direction over the counter substrate 20. Moreover, when two crossing patterns of streaky brightness unevenness 40 are perpendicular to each other, they are inconspicuous.

Figure 6:
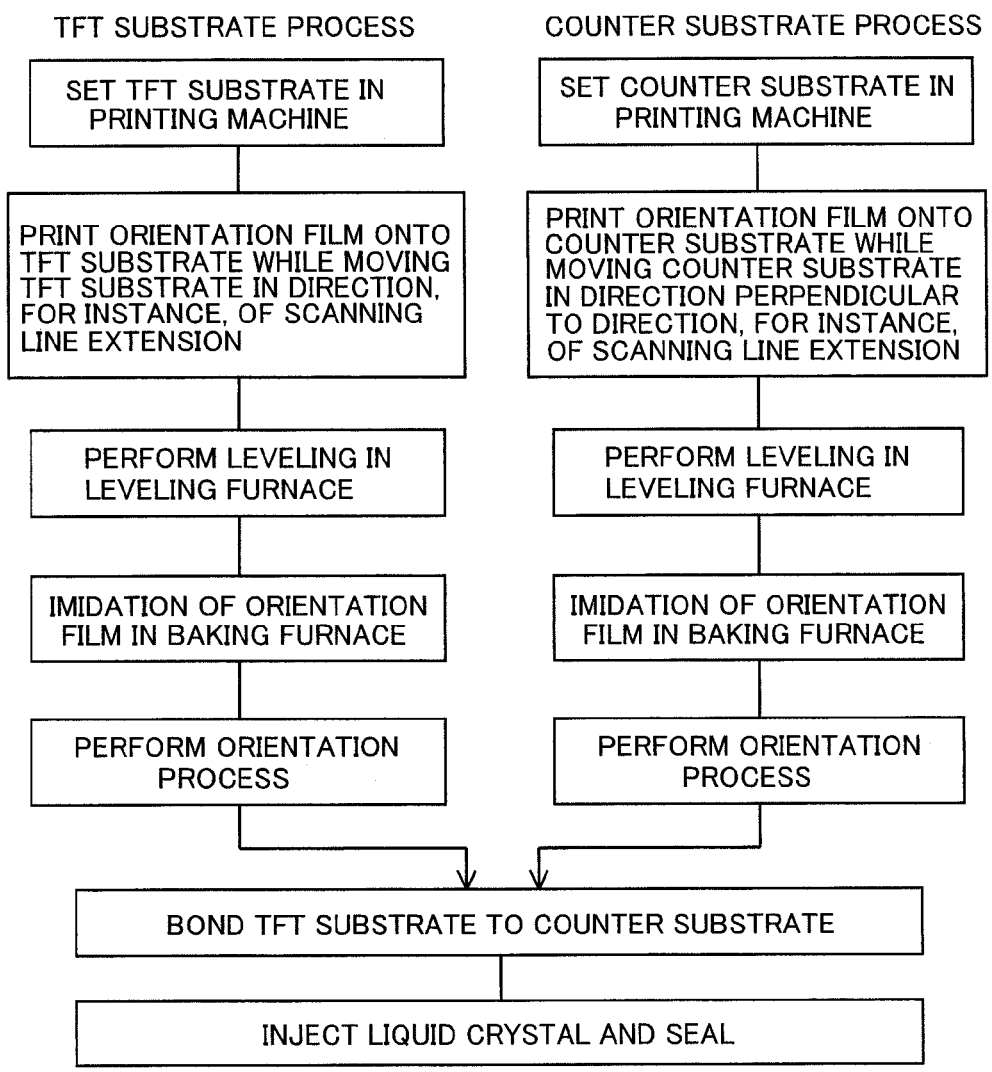
FIG. 6 is a process chart illustrating a liquid crystal display device manufacturing method according to the present invention.
Figure 7A:
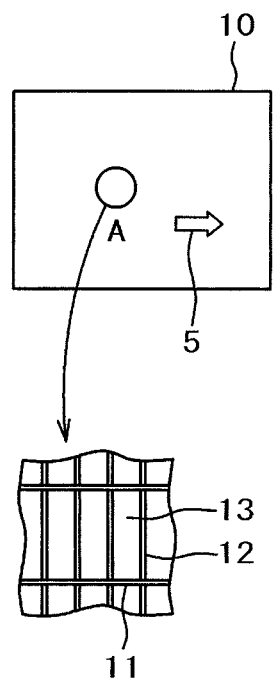
FIGS. 7A and 7B are schematic diagrams illustrating the directions in which the orientation films are printed onto the TFT substrate and the counter substrate when a conventional technology is used.
Figure 7B:
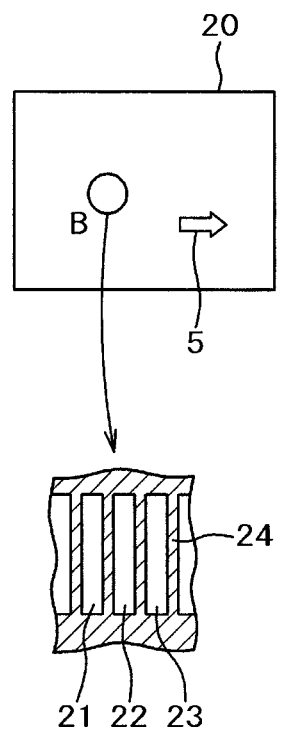
Figure 8:
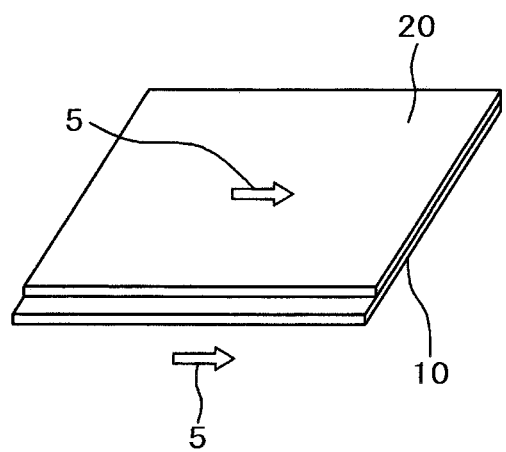
FIG. 8 is a perspective view illustrating the directions in which the orientation films are printed onto the TFT substrate and counter substrate for a liquid crystal display panel when the conventional technology is used.
Figure 9:
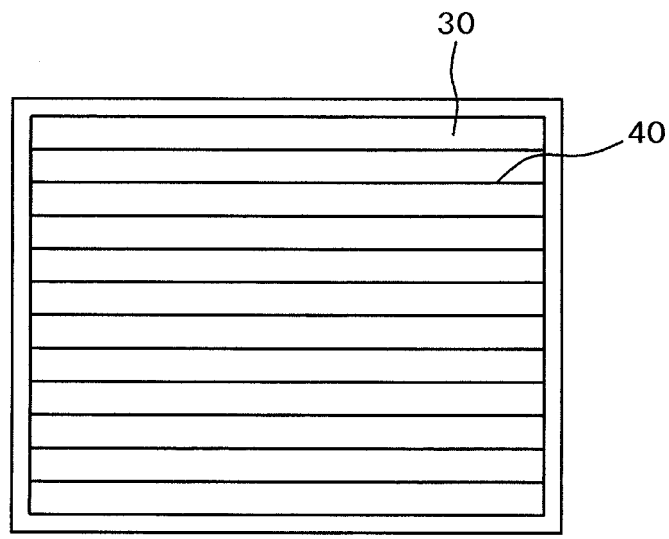
FIG. 9 shows an example of streaky brightness unevenness that appears when the conventional technology is used.
Figure 10:
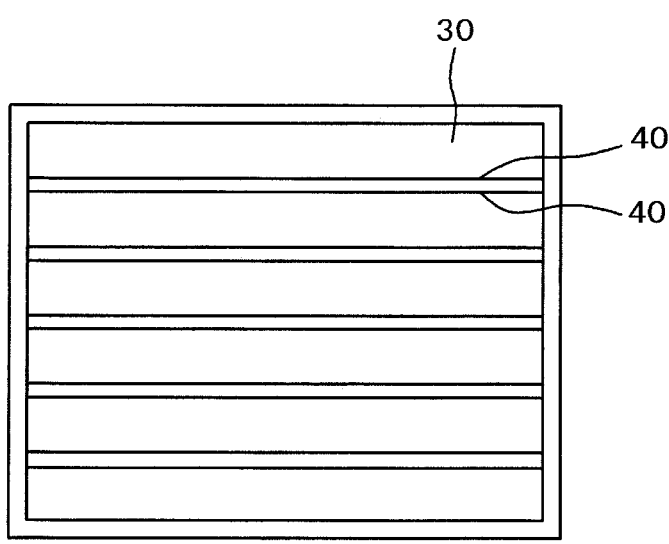
FIG. 10 shows another example of streaky brightness unevenness that appears when the conventional technology is used.

FIG. 6 is a process chart illustrating a liquid crystal display panel manufacturing process. In general, a mother TFT substrate, which includes a plurality of TFT substrates, and a mother counter substrate, which includes a plurality of counter substrates, are separately formed. After their orientation films are subjected to an orientation process, the mother TFT substrate is bonded to the mother counter substrate. The resulting combination of the mother TFT substrate and the mother counter substrate is then separated into individual liquid crystal display panels. However, it is assumed in FIG. 6 that merely a TFT substrate and a counter substrate are subjected to the manufacturing process.

A TFT substrate process is indicated on the left-hand side of FIG. 6. In the TFT substrate process, a TFT substrate 10 on which, for example, a TFT, a pixel electrode, a scanning line 11, and a video signal line 12 are formed is set in an offset printing machine. The offset printing machine operates in a manner described with reference, for instance, to FIG. 1. More specifically, damage or warp on the doctor blade 4, for example, is transferred to the TFT substrate 10 through an anilox roll 1 and a printing plate 2 to produce streaky film thickness unevenness. As the orientation film is printed onto the TFT substrate 10, for example, in the extension direction of the scanning line 11, streaky orientation film thickness unevenness is produced in the direction of the scanning line 11 over the TFT substrate 10. An orientation film material 6 dripped from an injection nozzle 3 shown in FIG. 1 has a viscosity, for instance, of 15 to 100 mPa·s.

As the orientation film material 6 applied by the offset printing machine is still in a liquid state, the TFT substrate 10 is introduced into a leveling furnace to dry the orientation film uniformly. The leveling furnace is maintained at a temperature between 70° C. and 90° C. At this time, the degree of thickness unevenness of the orientation film is reduced by a leveling effect. However, the streaky unevenness 40 produced by orientation film printing is not completely eliminated.

Subsequently, the TFT substrate 10 is introduced into a baking furnace, which is maintained at a temperature between 200° C. and 230° C., to imidize the orientation film. The orientation film formed in this manner generally has a thickness of approximately 80 nm to 120 nm. The formed orientation film is then subjected to an orientation process. The orientation process is generally performed by a rubbing method. However, an optical directional process may be performed in an IPS (In-Plane Switching) liquid crystal display device.

A counter substrate process is indicated on the right-hand side of FIG. 6. In the counter substrate process, a counter substrate 20 on which, for example, a black matrix, color filters, and an overcoat film are formed is set in an offset printing machine. In this instance, the counter substrate 20 is set in such a manner that the direction of orientation film printing is the same as the extension direction of the color filters formed on the counter substrate 20, that is, the direction perpendicular to the extension direction of the scanning line 11 for the TFT substrate 10. In this instance, too, the damage or warp on the doctor blade 4, for example, produces streaky film thickness unevenness in the direction of printing, as is the case with the TFT substrate 10. However, the direction of the streaky film thickness unevenness produced on the counter substrate 20 is perpendicular to the direction of the streaky film thickness unevenness produced on the TFT substrate 10.

After the orientation film is printed onto the counter substrate 20 as described above, the same steps are performed as for the TFT substrate 10. More specifically, the counter substrate 20 is introduced into the leveling furnace to level and dry the orientation film. Next, the counter substrate 20 is introduced into the baking furnace to imidize the orientation film. The imidized orientation film is then subjected to an orientation process. The temperature and other conditions to be selected for the leveling furnace and baking furnace are the same as those for the TFT substrate 10. The streaky orientation film thickness unevenness is also produced on the counter substrate 20. However, this streaky orientation film thickness unevenness is produced in a direction perpendicular to the direction of the streaky orientation film thickness unevenness produced on the TFT substrate 10.

The TFT substrate 10 and the counter substrate 20, which have been formed as described above, are bonded to each other through a sealing material. Next, liquid crystal is injected through an inlet. The inlet is then sealed to finish a liquid crystal display panel. As the liquid crystal display panel is formed as described above, the direction of the streaky orientation film thickness unevenness 40 produced on the TFT substrate 10 is perpendicular to the direction of the streaky orientation film thickness unevenness 40 produced on the counter substrate 20. Therefore, the brightness unevenness caused by the orientation film thickness unevenness is inconspicuous.

When printing film thickness unevenness is to be eliminated in an orientation film printing process, it is previously necessary to enhance the accuracy of orientation film printing equipment and strictly manage the printing process conditions. However, the present invention makes the brightness unevenness caused by the orientation film thickness unevenness inconspicuous without having to, for example, enhance the accuracy of orientation film printing equipment and manage the printing process conditions with increased strictness.

Second Embodiment

Figure 11:
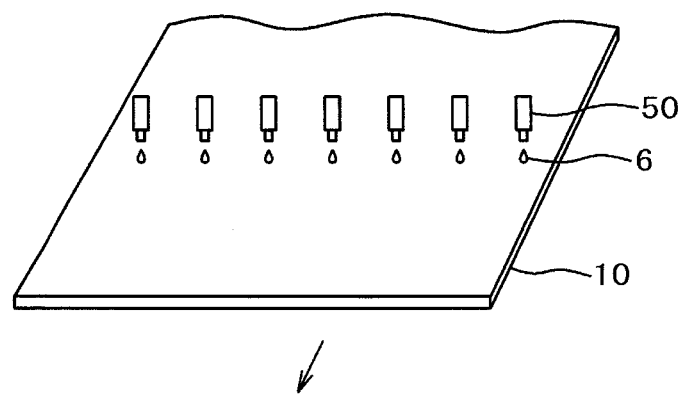
FIG. 11 is a perspective view illustrating a method of forming an orientation film on the TFT substrate by an inkjet method in accordance with the present invention.
Figure 12:
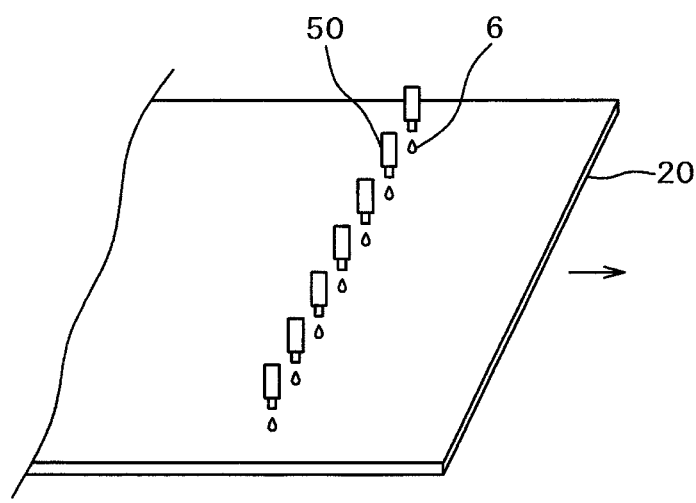
FIG. 12 is a perspective view illustrating a method of forming an orientation film on the counter substrate by the inkjet method in accordance with the present invention.

The first embodiment has been described on the assumption that an offset printing method is used to form the orientation films. However, the orientation films can also be formed by an inkjet method in addition to the offset printing method. FIGS. 11 and 12 are schematic diagrams illustrating the inkjet method that is used to form the orientation films. FIG. 11 shows how the orientation film is applied to the TFT substrate 10. Referring to FIG. 11, many inkjet nozzles are provided to drip the orientation film material 6. When the TFT substrate 10 moves in the direction of the arrow, the orientation film is applied thereto. In FIG. 11, the direction in which the TFT substrate 10 moves is, for example, the extension direction of the scanning line 11 formed on the TFT substrate 10.

When the orientation film is formed by the inkjet method, the employed material has a viscosity, for instance, of 5 to 10 mPa·s, which is lower than when the offset printing method is used for orientation film formation. As the viscosity of the orientation film material 6 is low, uniform film thickness is obtained when leveling is performed after orientation film application. However, there is still a film thickness difference between a place where a nozzle exists and a place where no nozzle exists. In this case, too, streaky film thickness unevenness appears.

In the past, the orientation films were applied while the TFT substrate 10 and the counter substrate 20 moved in the same direction. Therefore, the streaky orientation film thickness unevenness 40 for the liquid crystal display panel was produced in the same direction no matter whether it was produced on the TFT substrate 10 or on the counter substrate 20. In the past, therefore, even when the inkjet method was used for orientation film formation, brightness unevenness was produced as shown in FIG. 11 or 12.

In the present invention, as shown in FIG. 12, the direction in which the counter substrate 20 moves relative to the inkjet nozzles 50, which are arranged in-line, is perpendicular to the direction in which the TFT substrate 10 moves as shown in FIG. 11. More specifically, the counter substrate 20 moves, for example, in the extension direction of the color filters formed on the counter substrate 20. This direction is perpendicular to the extension direction of the scanning line 11 for the TFT substrate 10. Thus, the direction of the streaky orientation film thickness unevenness 40 produced on the counter substrate 20 is perpendicular to the direction of the streaky orientation film thickness unevenness 40 produced on the TFT substrate 10. The brightness unevenness produced by the orientation film thickness unevenness then looks like FIG. 5. The brightness unevenness shown in FIG. 5 is inconspicuous as described in connection with the first embodiment.

The method of manufacturing the liquid crystal display panel when the inkjet method is used for orientation film formation is basically the same as shown in FIG. 6 except that the inkjet method is used instead of the offset printing method. However, the orientation film material 6 applied by the inkjet method has a viscosity of 5 to 10 mPa·s, which is lower than when orientation film printing is performed. Further, the leveling furnace is maintained at a temperature between 20° C. and 60° C., which is lower than when orientation film printing is performed. The baking furnace temperature for imidation is the same as when the offset printing method is used.

As described above, even when the inkjet method is used for orientation film formation, the present invention makes it possible to address the problem of streaky brightness unevenness 40 without having to enhance the accuracy of inkjet printing equipment and impose remarkably strict conditions of orientation film formation process by the inkjet method.

The first and second embodiments have been described on the assumption that the direction of orientation film printing 5 for the TFT substrate 10 is the same as the extension direction of the scanning line 11, and that the direction of orientation film printing 5 for the counter substrate 20 is perpendicular to the scanning line 11. However, the same effect is obtained when, on the contrary, the direction of orientation film printing 5 for the TFT substrate 10 is the same as the extension direction of the video signal line 12 while the direction of orientation film printing 5 for the counter substrate 20 is perpendicular to the video signal line 12.

Third Embodiment

Figure 13:
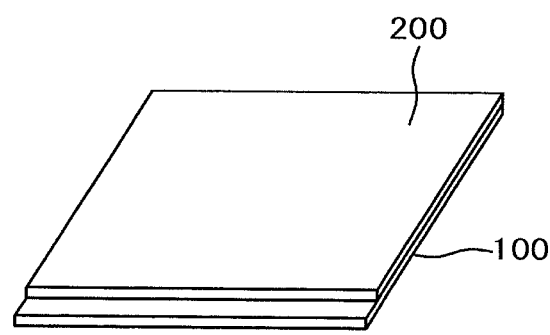
FIG. 13 is a perspective view illustrating an organic EL display panel.

The first and second embodiments represent the cases where the present invention is applied to the formation of orientation films for a liquid crystal display device. As the present invention avoids a situation where the same type of unevenness is produced in the same direction, it is also applicable to an organic EL display device. FIG. 13 is a perspective view illustrating an organic EL display panel. Referring to FIG. 13, an element substrate 100 on which, for example, an organic electroluminescent element, a control TFT, a video signal line 12, a scanning line 11, and a power supply line are formed is sealed by a sealing substrate 200. As the organic electroluminescent element is degraded by water, it is usually protected against water by the sealing substrate 200, which is made of transparent glass.

Figure 14:
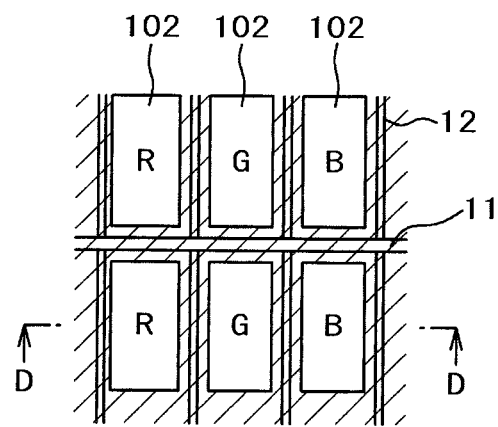
FIG. 14 is a plan view illustrating the configuration of an element substrate in an organic EL display device.

FIG. 14 is a schematic plan view of the element substrate 100 shown in FIG. 13. Referring to FIG. 14, the organic electroluminescent element is formed in a region enclosed by the scanning line 11, which is extended in the horizontal direction, and the video signal line 12, which is extended in the vertical direction. The organic electroluminescent element forms a red pixel R, a green pixel G, and a blue pixel B in accordance with light emitted from an employed organic material.

Figure 15:
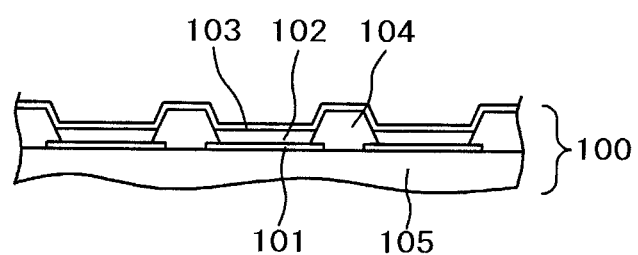
FIG. 15 is a cross-sectional view illustrating a pixel section shown in FIG. 14.

FIG. 15 is a cross-sectional view taken along line D-D in FIG. 14. It should be noted, however, that a portion below a planarizing film 105 is omitted from FIG. 15. Referring to FIG. 15, a bank 104 for zoning each pixel is formed on the planarizing film 105, which is formed by the organic material. Each pixel is formed between one bank 104 and the next 104. From bottom to top, elements of each pixel are a lower electrode 101, which serves as an anode, organic electroluminescent materials 102, and an upper electrode 103, which serves as a cathode. The upper electrode 103 is shared by the individual pixels.

The electroluminescent materials 102, which are organic materials, are formed either by a vapor deposition method or by an inkjet method. The inkjet method excels in productivity because it does not require a vacuum apparatus. When the inkjet method is used, a plurality of nozzles drip the electroluminescent materials 102 at predetermined positions on the element substrate 100.

Figure 16:
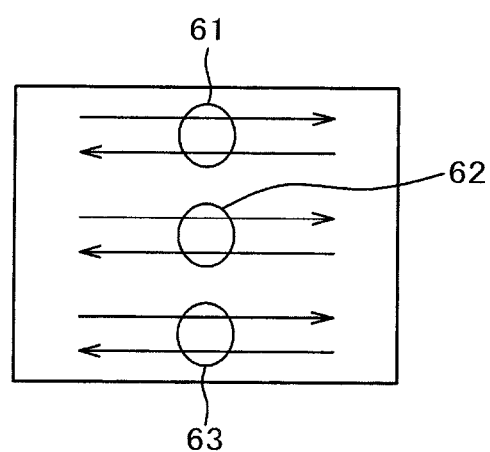
FIG. 16 shows the directions of inkjet nozzle scanning performed when the conventional technology is used.

The electroluminescent materials 102 may be dripped while the nozzles scan over the element substrate 100 or while the element substrate 100 moves. FIG. 16 is a schematic diagram illustrating the directions in which the electroluminescent materials 102 are formed by a conventional method while the inkjet nozzles 50 scan over the element substrate 100. In FIG. 16, the reference numerals 61, 62, and 63 respectively denote the inkjet nozzle scanning directions for a red electroluminescent material, a green electroluminescent material, and a blue electroluminescent material.

In the past, the inkjet nozzles scanned over the element substrate 100 in the same manner for the red, green, and blue electroluminescent materials as indicated in FIG. 16. However, when the element substrate 100 is scanned by the inkjet method to form pixels, peculiar unevenness is produced. If the same formation method is used for all materials as indicated in FIG. 16, the unevenness on each material tends to be accentuated and made conspicuous.

Figure 17A:
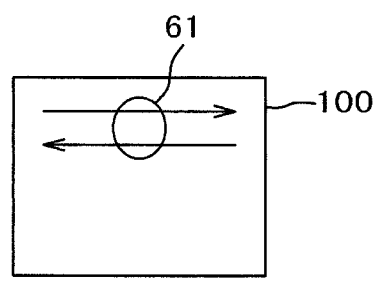
FIGS. 17A to 17C present color-specific examples illustrating the directions of inkjet nozzle scanning performed in accordance with the present invention.
Figure 17B:
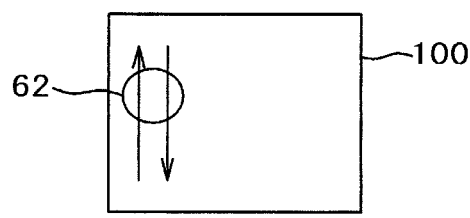
Figure 17C:
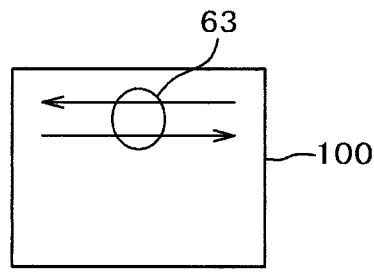

In the present embodiment, the organic electroluminescent materials 102 are formed by the inkjet method while the scanning direction of the inkjet nozzles 50 varies from one organic electroluminescent material to another as shown in FIGS. 17A to 17C. For example, FIG. 17A shows the inkjet nozzle scanning direction 61 for dripping the red material. The inkjet nozzles 50 are scanned from the left-hand side and in the horizontal direction of the element substrate 100, that is, in the extension direction of the scanning line 11 shown in FIG. 14. FIG. 17B shows the inkjet nozzle scanning direction 62 for dripping the green material. The inkjet nozzles 50 are scanned from the upper side and in the vertical direction of the element substrate 100, that is, in the extension direction of the video signal line 12 shown in FIG. 14. As described above, the direction in which the inkjet nozzles 50 are scanned for one color material is perpendicular to the direction in which the inkjet nozzles 50 are scanned for another color material. This prevents a phenomenon in which the formed unevenness is not accentuated.

FIG. 17C shows the inkjet nozzle scanning direction 63 for dripping the blue material. The inkjet nozzles 50 are scanned from the right-hand side and in the horizontal direction of the element substrate 100, that is, in the extension direction of the scanning line 11 shown in FIG. 14. The position at which the application of the blue material is initiated by the inkjet method differs from the position at which the application of the red material is initiated by the inkjet method because inkjet properties are such that unevenness may be produced depending on the time of application.

The inkjet application direction and inkjet application start position, for instance, for the red, green, and blue materials are not limited to those indicated in FIGS. 17A to 17C. Various alternative combinations may be employed. For example, the inkjet nozzles 50 may be scanned in the direction of the video signal line to form the red material, scanned in the direction of the scanning line to form the green material, and scanned in the same direction as for the red or green material to form the blue material.

As described above, when an organic electroluminescent layer is to be formed for an organic EL display device by the inkjet method, the present invention makes it possible to prevent a phenomenon in which the degrees of inkjet application unevenness of individual colors are mutually accentuated. Therefore, an organic EL display device exhibiting inconspicuous brightness unevenness can be manufactured.

What is claimed is:

1. A method of manufacturing an organic EL display device that includes an element substrate on which a first organic luminescent material and a second organic luminescent material are formed, the method comprising the steps of:
   forming the first organic luminescent material by dripping the first organic luminescent material from an inkjet nozzle on the element substrate while relatively moving the inkjet nozzle and the element substrate in a first direction; and
   forming the second organic luminescent material by dripping the second organic luminescent material from an inkjet nozzle on the element substrate while relatively moving the inkjet nozzle and the element substrate in a direction perpendicular to the first direction.

2. The organic EL display device manufacturing method according to claim 1, wherein a third organic luminescent material is formed in the organic EL display device, the method further comprising the step of:
   forming the third organic luminescent material by dripping the third organic luminescent material from an inkjet nozzle on the element substrate while relatively moving the inkjet nozzle and the element substrate in the first direction or in the direction perpendicular to the first direction.

* * * * *